(12) United States Patent
Maynard et al.

(10) Patent No.: US 6,728,911 B1
(45) Date of Patent: Apr. 27, 2004

(54) SYSTEM AND METHOD FOR TESTING MEMORY SYSTEMS

(75) Inventors: Stephen L. Maynard, Lake Zurich, IL (US); Mark O. Vogel, Hampshire, IL (US); Erhard Trudrung, Elgin, IL (US); Douglas Newlin, Wheaton, IL (US)

(73) Assignee: UTStarcom, Inc., Alameda, CA (US)

( * ) Notice: Subject to any disclaimer, the term of this patent is extended or adjusted under 35 U.S.C. 154(b) by 492 days.

(21) Appl. No.: 09/778,531

(22) Filed: Feb. 7, 2001

Related U.S. Application Data

(60) Provisional application No. 60/249,155, filed on Nov. 16, 2000.

(51) Int. Cl.[7] ............................ G11C 29/00; G11C 7/00
(52) U.S. Cl. ........................................ 714/718; 365/201
(58) Field of Search ............................ 714/718; 365/201

(56) References Cited

U.S. PATENT DOCUMENTS

| | | | | |
|---|---|---|---|---|
| 4,127,768 A | * | 11/1978 | Negi et al. ..................... 714/25 |
| 4,715,034 A | | 12/1987 | Jacobson ..................... 371/21 |
| 4,873,705 A | | 10/1989 | Johnson ..................... 371/21.2 |
| 4,918,378 A | | 4/1990 | Katircioglu et al. ........ 365/201 |
| 5,006,787 A | | 4/1991 | Katircioglu et al. ....... 324/73.1 |
| 5,034,923 A | | 7/1991 | Kuo et al. ............. 365/189.01 |
| 5,123,016 A | * | 6/1992 | Muller et al. ................ 714/711 |
| 5,138,619 A | | 8/1992 | Fasang et al. ............. 371/21.1 |
| 5,173,906 A | | 12/1992 | Dreibelbis et al. ......... 371/22.5 |
| 5,198,758 A | | 3/1993 | Iknaian et al. .......... 324/158 R |
| 5,199,034 A | | 3/1993 | Yeo et al. ................... 371/21.2 |
| 5,515,382 A | * | 5/1996 | Lassorie ..................... 714/730 |
| 5,689,466 A | * | 11/1997 | Qureshi ...................... 365/201 |
| 5,954,831 A | | 9/1999 | Chang ........................ 714/720 |
| 6,550,023 B1 | * | 4/2003 | Brauch et al. ................ 714/42 |
| 6,581,019 B1 | * | 6/2003 | Bapst et al. ................ 702/120 |
| 6,591,389 B1 | * | 7/2003 | Daudelin et al. ........... 714/733 |

* cited by examiner

*Primary Examiner*—David Ton
*Assistant Examiner*—Esaw Abraham
(74) *Attorney, Agent, or Firm*—McDonnell Boehnen Hulbert & Berghoff

(57) ABSTRACT

A system and method for testing memory systems in accordance with the present invention increases efficiency and reduces initial diagnostic and power up time for microprocessor-based units. The method includes copying a test process sequence into a memory system; updating an address indicative of the segment of the memory system being tested; comparing the address to an end of memory system address; copying the test process sequence to a next block of the memory system, and iterating through the method until the addresses are equal and the end of the memory system is reached.

16 Claims, 5 Drawing Sheets

FIG. 4

```
b_RAM_TEST:                                    ;;; 'C' CALLABLE: b_RAM_TEST (VOID);
                                               ;;; ASSUMPTIONS;
                                               ;;;   -EXEC'D FROM ROM, FLASH (ANYTHING BUT RAM)
                                               ;;;   -DESTROYS t0 THRU t7 & s0 THRU s7

;;; LOAD TEMP REGS & NV RAM VALUES
       la    t2, BEGIN                         ;;; START ADDRESS OF RAM TEST
       la    t3, END                           ;;; END ADDRESS OF RAM TEST
       la    t4, NVRAM_BASE+EXEC_ADDR          ;;; CURRENT ADDRESS BLOCK BEING TESTED
       la    t5, WATCHDOG                      ;;; WATCHDOG ADDRESS POINTER
       la    t1, NVRAM_BASE+EXEC_FLAGS         ;;; CURRENT TEST, FLAGS, & ERROR CODES
       li    t0, RAM_TEST | NO_FLAGS | RUN     ;;; START WITH NO FLAGS OR ERRORS AND "RUNNING"...
       sw    t0, (t1)
       la    t0, B_RT_START
       subu  t0, B_RT_END                      ;;; CALCULATE EXEC BLOCK LENGTH
       move  t6, t0                            ;;; SAVE LENGTH IN t6
       la    t0, B_RT_START
       lwm   t0, t6, s0                        ;;; READ THE EXEC BLOCK FROM THE ORIGINAL ADDRESS
       swm   t2, t6, s0                        ;;; WRITE THE EXEC BLOCK TO THE FIRST RAM ADDRESS
;;; DISABLE INTS, INSTRUCTION AND DATA CACHE
       li    t0, DCIC_I                        ;;; LOAD CACHE INHIBIT / INVALIDATE CONST
       mfc0  t7, C0_DCIC                       ;;; SAVE CURRENT CACHE STATE
       nop                                     ;;; DELAY SLOT FOR SR ACCESS
       mtc0  t0, C0_DCIC                       ;;; WRITE REG WITH DISABLED CACHE CONST
       nop                                     ;;; DELAY SLOT FOR SR ACCESS
       mfc0  t1, C0_SR                         ;;; SAVE CURRENT INTS STATE
       nop                                     ;;; DELAY SLOT FOR SR ACCESS
       and   t0, t1, SR_IEC                    ;;; t1 SAVES INTS STATE - t0 ONLY TEMP REG. NOW!
       mtc0  t0, C0_SR                         ;;; WRITE REG WITH DISABLED INTS
       j     t2                                ;;; JUMP TO RAM!!!
;;; EXEC-TEST RAM - (CACHE LINE == 8 INSTRUCTIONS)
B_RT_START:
       sw    t2, (t4)                          ;;; WRITE EXECUTION ADDRESS TO NV RAM
       sw    $0, (t5)                          ;;; RESET THE WATCHDOG (WRITE ANYTHING TO WDOG
                                                   ADDR)
       move  t0, t6                            ;;; COPY LENGTH TO t0
       add   t0, t2                            ;;; DERIVE NEW EXEC ADDRESS
       bgt   t0, t3, B_RT_END                  ;;; COMPARE TO END ADDRESS AND EXIT IF NECESSARY
       lwm   t2, t6, s0                        ;;; READ THE EXEC BLOCK FROM THE PREVIOUS
                                                   ADDRESS
       add   t2, t6                            ;;; POINT TO THE NEXT ADDRESS
       swm   t2, t6, s0                        ;;; WRITE THE EXEC BLOCK TO THE NEXT ADDRESS
                                               ;;; WARNING!!! EXECUTION "FALLS" INTO THE NEXT
                                                   RAM BLOCK
B_RT_END:                                      ;;; BACK AT B_RT_START (NOT HERE) - LOOKS LIKE
                                                   A LOOP!
       mtc0  t1, C0_SR                         ;;; RESTORE PREVIOUS INTS STATE
       la    t1, NVRAM_BASE+EXEC_FLAGS         ;;; CURRRENT TEST, FLAGS & ERROR CODES
       lw    t1, t0                            ;;; READ TEST STATUS
       li    t6, (~RUN)                        ;;; CLEAR "RUNNING" BIT
       and   t0, t6
       li    t6, TEST_OK                       ;;; SET "OK" (RAM TEST SUCCESS) BIT
       or    t0, t6
       sw    t0, (t1)                          ;;; WRITE TEST STATUS
       mtc0  t7, C0_DCIC                       ;;; RESTORE REG WITH PREVIOUS CACHE STATE
```

FIG. 5

```
b_RAM_TEST:                                    ;;; 'C' CALLABLE: b_RAM_TEST (VOID);
                                               ;;; ASSUMPTIONS;
                                               ;;;   -EXEC'D FROM ROM, FLASH (ANYTHING BUT RAM)
                                               ;;;   -DESTROYS gr90 THRU gr97 & gr80 THRU gr87
;;; LOAD TEMP REGS & NV RAM VALUES
    addi  gr90, gr90, $0
    addi  gr92, gr90, BEGIN                    ;;; START ADDRESS OF RAM TEST
    addi  gr93, gr90, END                      ;;; END ADDRESS OF RAM TEST
    addi  gr94, gr90, NVRAM_BASE+EXEC_ADDR     ;;; CURRENT ADDRESS BLOCK BEING TESTED
    addi  gr95, gr90, WATCHDOG                 ;;; WATCHDOG ADDRESS POINTER
    addi  gr91, gr90, NVRAM_BASE+EXEC_FLAG     ;;; CURRENT TEST, FLAGS, & ERROR CODES
    addi  gr90, gr90, RAM_TEST/NO_FLAGS/RUN    ;;; START WITH NO FLAGS OR ERRORS AND
                                                   "RUNNING"...
    stw   gr90, (gr91)
    addi  gr90, gr90, $0
    addi  gr90, gr90, B_RT_START
    subf  gr96, gr90, B_RT_END                 ;;; CALCULATE EXEC BLOCK LENGTH (SAVE LENGTH IN t6)
    lmw   gr90, gr96, gr80                     ;;; READ THE EXEC BLOCK FROM THE ORIGINAL ADDRESS
    stmw  gr92, gr96, gr80                     ;;; WRITE THE EXEC BLOCK TO THE FIRST RAM ADDRESS
;;; DISABLE INTS, INSTRUCTION AND DATA CACHE
    addi  gr90, gr90, $0                       ;;; LOAD CACHE INHIBIT / INVALIDATE CONST
    mfspr gr97, ICCR                           ;;; SAVE CURRENT CACHE STATE
    mtspr gr90, ICCR                           ;;; WRITE REG WITH DISABLED I-CACHE CONST
    mtspr gr90, DCCR                           ;;; WRITE REG WITH DISABLED D-CACHE CONST
    mfspr gr91, MSR                            ;;; SAVE CURRENT INTS STATE
    andi  gr90, gr91,~(IE)                     ;;; t1 SAVES INTS STATE - t0 ONLY TEMP REG. NOW!
    mtspr gr90, MSR                            ;;; WRITE REG WITH DISABLED INTS
    b     gr92                                 ;;; JUMP TO RAM!!!
;;; EXEC-TEST RAM - (CACHE LINE == 8 INSTRUCTIONS)
B_RT_START:
    stw   gr92, (gr94)                         ;;; WRITE EXECUTION ADDRESS TO NV RAM
    stw   $0, (gr95)                           ;;; RESET THE WATCHDOG (WRITE ANYTHING TO WDOG
                                                   ADDR)
    addi  gr90, gr96, $0                       ;;; COPY LENGTH TO t0
    add   gr90, gr92                           ;;; DERIVE NEW EXEC ADDRESS
    bgt   gr90, gr93, B_RT_END                 ;;; COMPARE TO END ADDRESS AND EXIT IF NECESSARY
    lmw   gr92, gr96, gr80                     ;;; READ THE EXEC BLOCK FROM THE PREVIOUS
                                                   ADDRESS
    add   gr92, gr96                           ;;; POINT TO THE NEXT ADDRESS
    stmw  gr92, gr96, gr80                     ;;; WRITE THE EXEC BLOCK TO THE NEXT ADDRESS
                                               ;;; WARNING!!! EXECUTION "FALLS" INTO THE NEXT
                                                   RAM BLOCK
B_RT_END:                                      ;;; BACK AT B_RT_START (NOT HERE) - LOOKS LIKE
                                                   A LOOP!
    mtspr MSR, gr91                            ;;; RESTORE PREVIOUS INTS STATE
    addi  gr91, gr91, NVRAM_BASE+EXEC_FLAGS    ;;; CURRRENT TEST, FLAGS & ERROR CODES
    lwz   gr91, gr90                           ;;; READ TEST STATUS
    lswi  gr96, (~RUN)                         ;;; CLEAR "RUNNING" BIT
    and   gr90, gr90, gr96
    lswi  gr96, TEST_OK                        ;;; SET "OK" (RAM TEST SUCCESS) BIT
    or    gr90, gr90, gr96
    stw   gr90, (gr91)                         ;;; WRITE TEST STATUS
    mtspr ICCR, gr97                           ;;; RESTORE REG WITH PREVIOUS CACHE STATE
```

SYSTEM AND METHOD FOR TESTING MEMORY SYSTEMS

RELATED APPLICATIONS

This application claims priority to U.S. Provisional Application No. 60/249,155 filed Nov. 16, 2000, the entire teaching of which is incorporated herein by reference.

FIELD OF THE INVENTION

This present invention relates to memory systems, and more particularly to a system and method for testing memory systems.

BACKGROUND OF THE INVENTION

Recent developments in semiconductor memory technology have substantially increased the use of memories, in particular Random Access Memory (RAM). RAM is the place in a computer where the operating system, application programs, and data in current use are kept so that they can be quickly reached by the computer's process. RAM is much faster to read from and write to than the other kinds of storage devices in a computer, such as, for example the hard disk, floppy disk, and CD-ROM. However, the data in RAM stays there only as long as a computer is running. When the computer is turned off, RAM loses its data. When the computer is turned on again, the operating system and other files are once again loaded into RAM, usually from the hard disk.

RAM can be compared to a person's short-term memory and the hard disk to the long-term memory. The short-term memory focuses on work at hand, but can only keep so many facts in view at one time. If short-term memory fills up, the brain sometimes is able to refresh it from facts stored in long-term memory. A computer also works similarly. If RAM fills up, the processor needs to continually go to the hard disk to overlay old data in RAM with new, slowing down the computer's operation. Unlike the hard disk which can become completely full of data so that it won't accept any more, RAM may be paged to and from an alternate storage area. It keeps operating, but much more slowly than is desirable.

RAM is small, both in physical size, as it is stored in a microchip and in the amount of data it can hold. It is much smaller than the hard disk. A typical computer may come with thirty-two (32) million bytes of RAM and a hard disk that can hold four (4) billion bytes. RAM comes in the form of a "discrete" microchip and also in the form of modules that may connect to the computer's motherboard. These modules connect through a bus or set of electrical paths to the processor. The hard drive, on the other hand, stores data on a magnetized surface that looks like a phonograph record.

Today's personal computers come with sixteen (16) or more megabytes of RAM, usually increasing in multiples of eight (8) megabytes. Users of graphic applications usually need thirty-two (32) or sixty-four (64) megabytes of memory. Most personal computers are designed to allow the user to add additional RAM modules up to a certain limit (for example, up to 64 or 128 megabytes). Having more RAM in the computer reduces the number of times that the computer processor has to read data in from the hard disk, an operation that takes much longer than reading data from RAM. RAM access time takes nanoseconds while hard disk access time takes milliseconds.

RAM is called "random access" because any storage location can be accessed directly. Originally, the term distinguished regular core memory from offline memory, usually on magnetic tape in which an item of data could only be accessed by starting from the beginning of the tape and finding an address sequentially. RAM is organized and controlled in a way that enables data to be stored and retrieved directly to specific locations. Another term for RAM is direct access storage or memory. Note that other forms of storage such as the hard disk and CD-ROM are also accessed directly (or "randomly") but the term random access is not applied to these forms of storage.

Nonvolatile random access memory (NVRAM) is a form of static random access memory whose contents are saved when a computer is turned off or if a computer loses its external power source. NVRAM can be implemented by providing static RAM with backup battery power or by saving its contents and restoring them from an electrically erasable programmable Read-Only Memory (ROM). Some modems use NVRAM as a place to keep preset or user-specified phone numbers and modem profiles.

Testing memory systems remains a major concern even though there are many techniques and procedures available. However, there are no efficient means of testing Random Access Memory (RAM) in a single pass. Most systems today run a variety or combination of tests to ensure that execution is possible from a given memory space. These multiple pass or multiple tests consume precious boot-up time.

Therefore, there is still a need to be able to test memory systems, such as RAM, in a single pass and verify that it is suitable for program execution.

SUMMARY OF THE INVENTION

The present invention includes a method of and system for high-speed functional and/or execution testing of memory systems such as, but not limited to, Random Access Memories (RAM) in microprocessor-based units or boards. The system and method of the present invention reduces the number of tests run on memory systems thereby increasing efficiency and reducing initial diagnostic and power up time. The system and method of the present invention can test, for example, but not limited to, aspects such as burst read, burst write, execution and dataline. The memory test of the present invention includes a system that is effectively coupled to the microprocessor-based unit under bus structure during test execution and operates on the unit under its own clock rate. The test process sequence may be stored in the unit in its own memory, or may be electrically transferred to the test system's memory via an external device such as, for example, an In-Circuit Emulator (ICE memory overlay).

In accordance with a preferred embodiment, the method for testing a memory system includes copying a test process sequence into the memory system, updating a first address indicative of a segment of the memory system being tested and resetting a timer such as a watchdog timer. The method further includes comparing the first address to a second address indicative of the end of the segment of the memory system; and copying the test process sequence to a next segment or block of the memory system and iterating through the previous method steps until the first address indicative of the segment of the memory system being tested is equal to the second address indicative of the end of the memory system. The test process sequence may be thought of as self-propagating as it copies itself through the plurality of segments of the memory system, tests the particular segment for burst read, burst write, execution and dataline aspects as a minimum and moves to the next sequential segment.

The foregoing and other features and advantages of the system and method for testing memory systems will be apparent from the following more particular description of preferred embodiments of the system and method as illustrated in the accompanying drawings in which like reference characters refer to the same parts throughout the different views.

BRIEF DESCRIPTION OF THE DRAWINGS

Preferred embodiments of the present invention are described with reference to the following drawings, wherein:

FIG. 4 is a listing of an exemplary code of a memory test process sequence in accordance with a preferred embodiment of the present invention; and FIG. 5 is a listing of an exemplary code of a memory test process sequence in accordance with another preferred embodiment of the present invention.

DETAILED DESCRIPTION OF PREFERRED EMBODIMENTS

The present invention is directed to a system and method for testing memory systems such as, but not limited to, Random Access Memory (RAM).

Figure 1A:
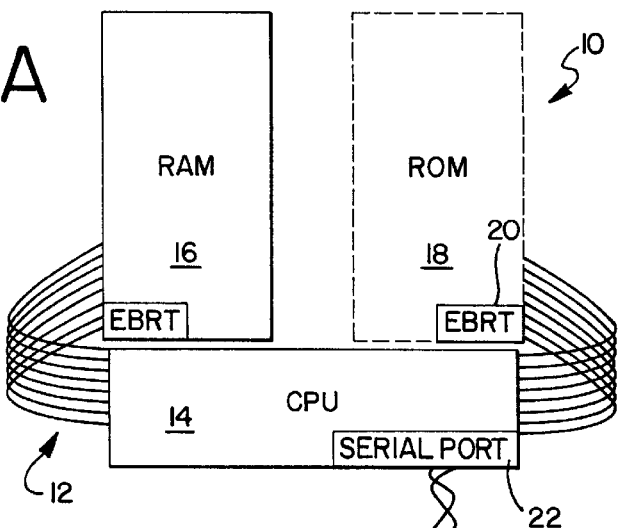
FIGS. 1A–1C are diagrams illustrating preferred embodiments of an apparatus to test memory systems in accordance with the present invention.
Figure 1B:
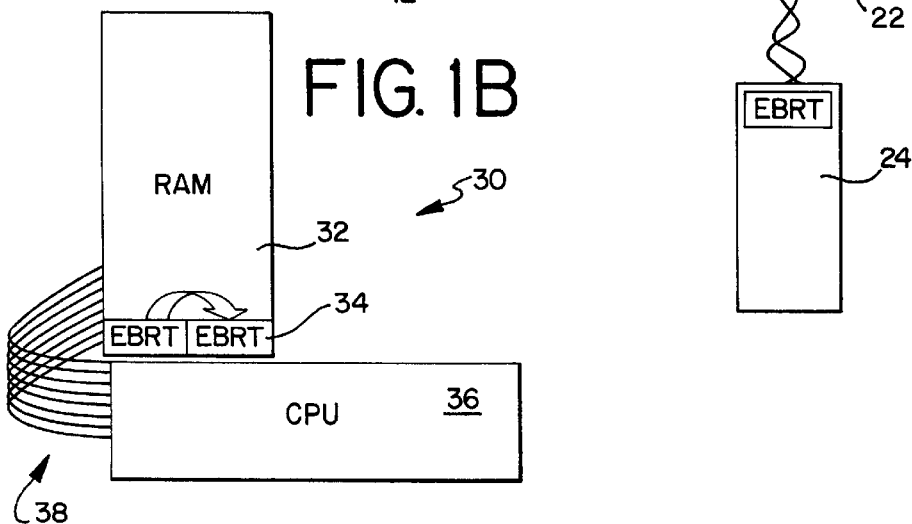
Figure 1C:
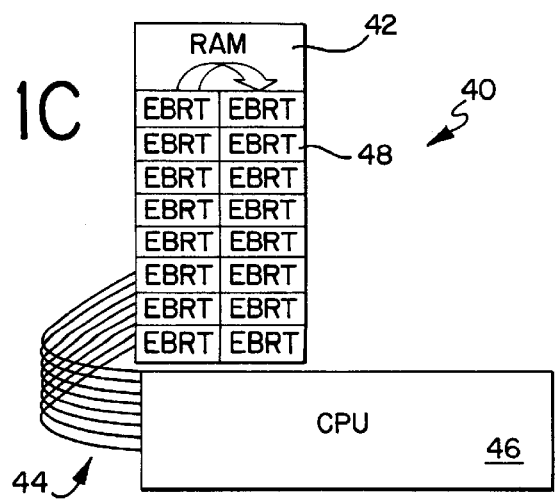

FIGS. 1A–1C are preferred embodiments of systems to test memory in accordance with the present invention. The memory test of the present invention includes a system that is effectively coupled to the microprocessor-based unit 14, 36, 46 under bus structure 12, 38, 44 during test execution and operates on the unit under its own clock rate. The memory test of the present invention includes a test process sequence 20 which may be stored in the unit in its own memory, or may be electrically transferred to the test system's memory via an external device 24 such as, for example, an In-Circuit Emulator (ICE memory overlay). Memory overlay is a technique that allows a test system to electrically substitute its own instructions for the instructions that its microprocessor attempts to read from the program memory of the unit being tested. Memory testing speed may be increased by taking advantage of block read and block write (burst) features of some microprocessors.

As illustrated in FIG. 1A the Executable Burst Ram Test (EBRT) 20 process sequence is copied from its source into RAM 16 at the desired starting address. In another preferred embodiment, the source may be local Read Only Memory (ROM) 18 within the same CPU/memory subsystem.

As illustrated in FIG. 1B, with the EBRT 34 process sequence loaded into RAM 32, the execution address of the Central Processing Unit (CPU) 36 is switched to the address where the process sequence was loaded or resident.

As illustrated in FIG. 1C, the EBRT 48 process sequence executing through the CPU 46 propagates itself through RAM 42 until the address at the end of the memory is reached or a failure forces a reboot or watchdog timer hit.

An operating environment for the system 10, 30, 40 includes a processing system with at least one high speed processing unit 14, 36, 46 and a memory system 16, 18, 32, 42. In accordance with the practices of persons skilled in the art of computer programming, the present invention is described with reference to acts and symbolic representations of operations or instructions that are performed by the processing system, unless indicated otherwise. Such acts and operations or instructions are sometimes referred to as being "computer-executed", or "processing unit executed."

It will be appreciated that the acts and symbolically represented operations or instructions include the manipulation of electrical signals by the processing unit. An electrical system with data bits causes a resulting transformation or reduction of the electrical signal representation, and the maintenance of data bits at memory locations in the memory system to thereby reconfigure or otherwise alter the processing unit's operation, as well as other processing of signals. The memory locations where data bits are maintained are physical locations that have particular electrical, magnetic, optical, or organic properties corresponding to the data bits.

The data bits may also be maintained on a computer readable medium including magnetic disks, optical disks, organic disks, and any other volatile or non-volatile mass storage system readable by the processing unit. The computer readable medium includes cooperating or interconnected computer readable media, which exist exclusively on the processing system or is distributed among multiple interconnected processing systems that may be local or remote to the processing system.

In a preferred embodiment, the processing unit is capable of burst access to external memories, i.e., read and write. In addition, it has interim storage for the information read, i.e. temporary registers, at least one pointer to an external location, or internal memory. The processor and software calling the memory test described herein has eight temporary registers and two word-length non-volatile storage areas for the test access and/or update. "Burst" access, in a preferred embodiment, implies cache-line and therefore block or segment size.

Processors capable of caching memory typically burst a section of memory into cache (or internal storage) and access the required area from cache (or the internal storage). The amount of memory "cached" is called a cache-line, typically word-aligned, and its length is determined by the pipe length of the processor or the tag size of the cache memory. Many processors have a minimum cache-line size of eight words. Thus, a single byte access in a cached memory region causes an effective eight word read. Since most accesses are for more information than a byte or word, and most processor architectures provide for non-taxing cache fill, caching of memory becomes efficient.

It should also be noted that central processing unit (CPU) memory systems have inherent boundaries that usually center around powers of two. These boundaries may affect either the data or address bus. Selecting a number of instructions that are not powers of two, may force the execution of the method of testing memory systems in accordance with the present invention across the boundaries.

The system and method for testing memory systems in accordance with a preferred embodiment of the present invention exploits caching functionality for the benefit of rapid memory evaluation. It carefully selects a small amount of instructions that fit within a cache-line and designs a test that operates within that amount of instructions to be efficient and reduce initial diagnostic and power up time.

Figure 2:
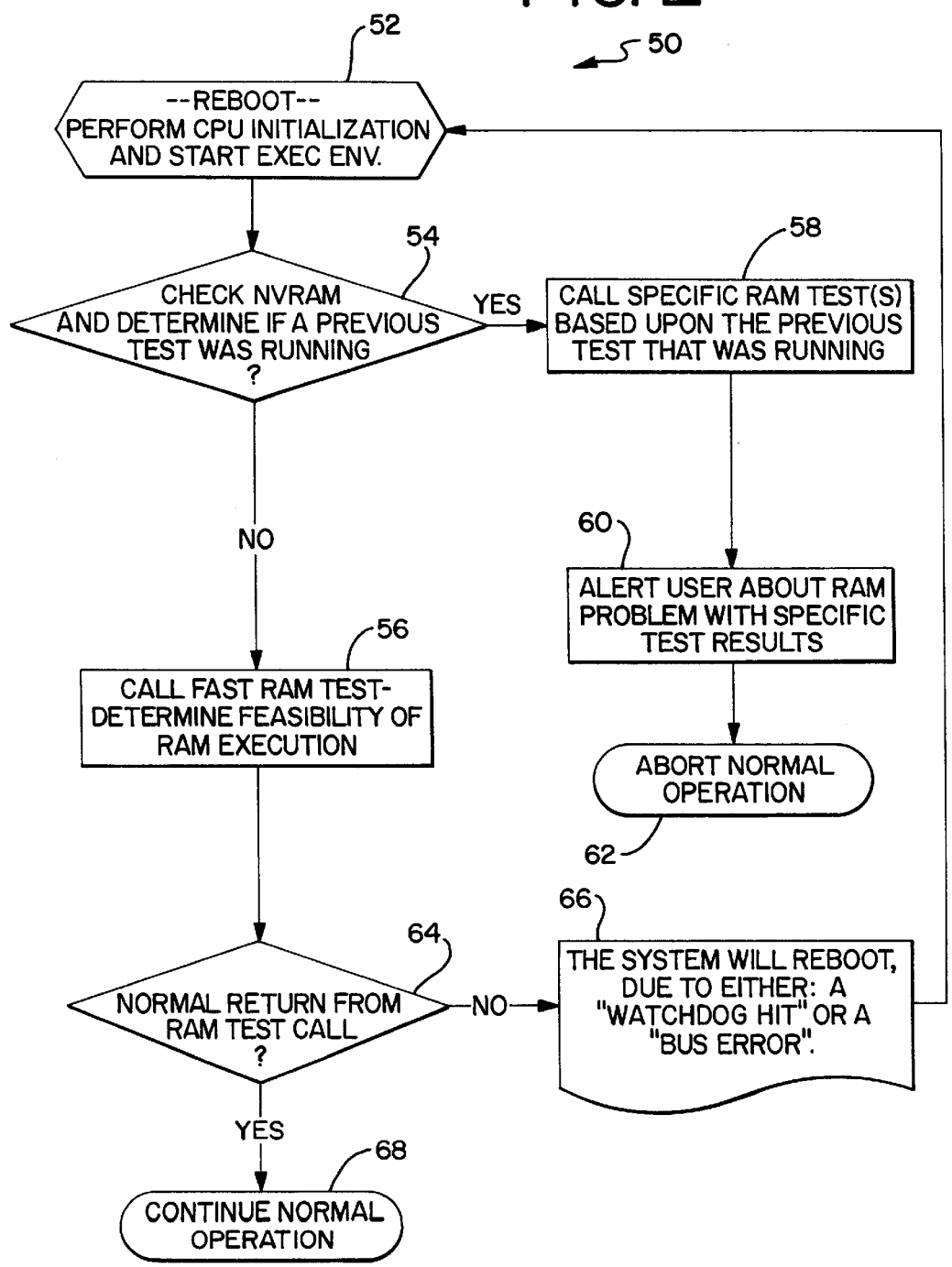
FIG. 2 is a flowchart illustrating a preferred embodiment of the power on self test system and method for testing memory in accordance with the present invention.

FIG. 2 is a flowchart illustrating a Power On Self Test (POST) method 50 in accordance with a preferred embodiment of the present invention. The system powers up or reboots and performs Central Processing Unit (CPU) initialization per step 52. The NVRAM is checked to determine if a previous burst memory test, in particular, a RAM test had failed per step 54. An execution test flag may be used to check the NVRAM to determine if any previous test had failed.

If a previous burst RAM test was running, more tests need to be run to determine the exact cause of the previous RAM failure. Per step 58, specific RAM test or tests based upon the previous test are called. The "execution test flag" and "execution address" in NVRAM are cleared. The "execution test flag" is used to determine if a previous burst RAM test failed. This flag is set before a test and indicates that a test is in progress. This flag is cleared upon successful completion of the burst RAM test. The "execution address" is used to indicate the location in RAM where the burst RAM test is running. The execution address is used to determine the approximate location of a burst RAM test failure. The user is alerted to the RAM problem with specific test results per step 60. These tests may concentrate on the area of RAM near the "execution address" to pinpoint the RAM failure quickly. Once the exact cause of the RAM failure is determined, the user can be alerted to take a specific course of action to fix the problem. Normal operation is aborted per step 62 as problems exist with the memory system.

Figure 3:
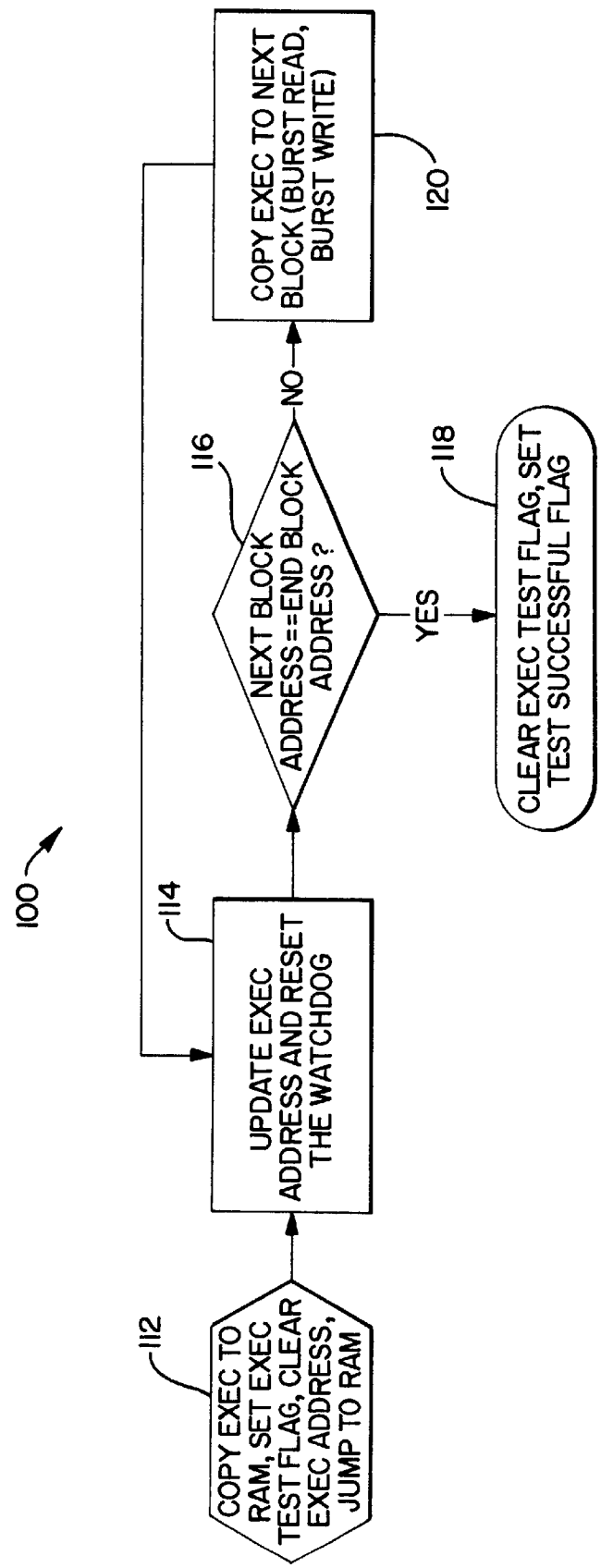
FIG. 3 is a flowchart illustrating a method for testing a memory system in accordance with a preferred embodiment of the present invention.

If a previous burst RAM test was not running as determined in step 54, the burst RAM test process sequence in accordance with the present invention is called in step 56 and is copied into RAM and is executed as discussed with respect to the flowchart described in FIG. 3. It is determined in step 64 if there has been a normal return from the RAM test as described herein below. If not, then the system reboots due to either a watchdog hit or a bus error per step 66 and the method 50 iterates through the process steps as discussed herein. To simplify the method of testing memory in accordance with a preferred embodiment, a failure is presented in the form of a reboot. The reboot is caused by one of the following possibilities: an illegal central processing unit (CPU) operation (access or instruction) which causes a "trap" or an "interrupt" that leads to a reset or an errant execution path (continuous loop, improper instruction read from any tested address), which causes a "watchdog" timer to reset the CPU. However, if there is a normal return from the RAM test, then the microprocessor-based unit continues with normal operation per step 68.

FIG. 3 is a flowchart illustrating a preferred embodiment of the method 100 of a memory test process sequence in accordance with the present invention. The method 100 is described with respect to a RAM system, however it is applicable to any memory system that provides read and write functionality. The execution of the method 100 is a repetitive process of the following steps beginning with the executable test process sequence getting copied to RAM, setting an executable test flag, clearing an executable address and starting the RAM test per step 112. In step 114, the executable address is updated and a timer such as a watchdog timer is reset. Thus, the execution address in NVRAM is updated with the current program counter. In step 116, it is determined if the next segment or block address is the same as the end block address by comparing the "execution address" to the "end block address" to determine if the testing is complete. A burst RAM test completes successfully if the execution address is equal to or greater than the "end block address". If the testing is completed successfully, then per step 118 the executable test flag is cleared and the test successful flag is set. Normal operation of the system continues from here. If the testing is not completed successfully, then per step 120, the executable test process sequence is copied to the next block and the process iterates through from step 114.

FIG. 4 is a listing of an exemplary code of a memory test process sequence in accordance with a preferred embodiment of the present invention. This test process sequence is configured to be executed on a microprocessor-based unit such as, for example, a millions of instructions per second (MIPS) computing device, a large computer server or mainframe.

FIG. 5 is another listing of an exemplary code of a memory test process sequence in accordance with a preferred embodiment of the present invention. This test process sequence is configured to be executed on a microprocessor-based unit such as, for example, a personal computer.

It should be understood that the programs, processes, methods and systems described herein are not related or limited to any particular type of computer or network system (hardware or software), unless indicated otherwise. Various types of general purpose or specialized computer systems may be used with or perform operations in accordance with the teachings described herein.

In view of the wide variety of embodiments to which the principles of the present invention can be applied, it should be understood that the illustrated embodiments are exemplary only, and should not be taken as limiting the scope of the present invention. For example, the steps of the flow diagrams may be taken in sequences other than those described, and more or fewer elements may be used in the block diagrams. While various elements of the preferred embodiments have been described as being implemented in software, in other embodiments hardware or firmware implementations may alternatively be used, and vice-versa.

It will be apparent to those of ordinary skill in the art that methods involved in the system and method for testing memory systems may be embodied in a computer program product that includes a computer usable medium. For example, such a computer usable medium can include a readable memory device, such as, a hard drive device, a CD-ROM, a DVD-ROM, or a computer diskette, having computer readable program code segments stored thereon. The computer readable medium can also include a communications or transmission medium, such as, a bus or a communications link, either optical, wired, or wireless having program code segments carried thereon as digital or analog data signals.

The claims should not be read as limited to the described order or elements unless stated to that effect. Therefore, all embodiments that come within the scope and spirit of the following claims and equivalents thereto are claimed as the invention.

What is claimed is:

1. A method for testing an executable memory system, comprising:
   a) copying a test process sequence to a segment of the memory system and executing the test process sequence from the segment;
   b) updating a first address indicative of a segment of the memory system being tested and setting a first timer;
   c) comparing the first address indicative of the segment of the memory system being tested to a second address indicative of an end of the memory system; and
   d) copying the test process sequence to a next segment of the memory system and repeating steps b), c), and d)

until the first address indicative of the segment of the memory system being tested is equal to the second address indicative of the end of the memory system.

2. A method of claim 1, wherein the memory system is a Random Access Memory.

3. A computer readable medium having stored therein instructions for causing a central processing unit to execute the steps of the method of claim 1.

4. The method of claim 1, wherein the test process sequence tests read, write, execute, and burst qualities of the memory system.

5. The method of claim 1, wherein the test process sequence copies itself through the memory system.

6. The method of claim 1, wherein the test process sequence has a size which is equal to or smaller than a cache-line size of a processing unit.

7. The method of claim 1, wherein the test process sequence has a size which is larger than a multiple cache-line size of the processing unit.

8. The method of claim 1, wherein an amount, and size of the data copied force testing certain address and data bit boundaries.

9. The method of claim 1, wherein a previous state and address are maintained across failure conditions such as one of at least reboots, power-loss, bus errors, and watchdog timer expiration.

10. The method of claim 1, wherein the first timer is a watchdog timer.

11. An apparatus for testing an executable memory system, the apparatus comprising in combination:

a processing module; and a memory system operably coupled to the processing module, wherein the memory system stores operational instructions that cause the processing module to copy a test process sequence to a segment of the memory system and execute the test process sequence from the segment; update a first address indicative of a segment of the memory system being tested and reset a first timer; compare the first address indicative of the segment of the memory system being tested to a second address indicative of an end of the memory system; copy the test process sequence to a next segment of the memory system and repeat the steps of the operational instructions until the first address indicative of the segment of the memory system being tested is equal to the second address indicative of the end of the memory system.

12. The apparatus of claim 11, wherein the memory system is a Random Access Memory.

13. The apparatus of claim 11, wherein the test process sequence tests read, write, execute and burst qualities of the memory system.

14. The apparatus of claim 11, wherein the test process sequence has a size which is equal to or smaller than a cache-line size of the processing module.

15. The apparatus of claim 11, wherein the test process sequence has a size which is larger than or a multiple of a cache-line size of the processing module.

16. The apparatus of claim 11, wherein the first timer is a watchdog timer.

* * * * *